United States Patent
Wrobel et al.

(10) Patent No.: US 10,986,748 B1
(45) Date of Patent: Apr. 20, 2021

(54) INPUT/OUTPUT SYSTEM

(71) Applicant: Rockwell Automation Technologies, Inc., Mayfield Heights, OH (US)

(72) Inventors: Adam M. Wrobel, Gates Mills, OH (US); Doug A. Lostoski, Richfield, OH (US); Brian T. Estanek, Lyndhurst, OH (US); Daniel E. Killian, Eastlake, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/584,057

(22) Filed: Sep. 26, 2019

(51) Int. Cl.
*H05K 5/00* (2006.01)
*H05K 7/14* (2006.01)

(52) U.S. Cl.
CPC ......... *H05K 7/1465* (2013.01); *H05K 7/1468* (2013.01); *H05K 7/1474* (2013.01); *H05K 7/1477* (2013.01); *H05K 7/1484* (2013.01)

(58) Field of Classification Search
USPC ....................................................... 361/731
See application file for complete search history.

(56) References Cited

U.S. PATENT DOCUMENTS

| 6,033,268 | A  | * | 3/2000  | Piper ........................ H01R 9/22 439/715 |
| 6,175,932 | B1 | * | 1/2001  | Foote .................... G06F 13/409 710/10 |
| 6,371,435 | B1 |   | 4/2002  | Landis et al. |
| 6,425,770 | B1 |   | 7/2002  | Lostoski et al. |
| 6,549,034 | B1 |   | 4/2003  | Pietrzyk et al. |
| 6,654,255 | B2 | * | 11/2003 | Kruse .................... H04Q 1/116 174/480 |
| 6,767,223 | B2 |   | 7/2004  | Lostoski et al. |
| 6,909,923 | B2 |   | 6/2005  | Vasko et al. |
| 7,596,635 | B2 |   | 9/2009  | Siorek et al. |
| 7,602,617 | B2 |   | 10/2009 | Brandt et al. |
| 8,149,554 | B2 |   | 4/2012  | Pietrzyk et al. |
| 8,184,417 | B2 |   | 5/2012  | Pietrzyk et al. |
| 8,441,766 | B2 |   | 5/2013  | Pietrzyk et al. |
| 8,769,158 | B2 |   | 7/2014  | Kretschmann et al. |
| 9,136,648 | B2 |   | 9/2015  | Molnar |
| 9,325,110 | B2 |   | 4/2016  | Lostoski et al. |
| 9,966,714 | B1 | * | 5/2018  | Sreedharan .......... H01R 9/2675 |

(Continued)

FOREIGN PATENT DOCUMENTS

| DE | 102011001274 A1 | 9/2012 |
| EP | 2736062 A1 | 5/2014 |

(Continued)

OTHER PUBLICATIONS

Rockwell Automation Manual titled "Point I/O", Publication 1734-IN510B-EN-P, Aug. 2000.

(Continued)

*Primary Examiner* — Hung S. Bui
(74) *Attorney, Agent, or Firm* — Fay Sharpe LLP

(57) ABSTRACT

An I/O system having redundant removable and/or replaceable components. Each of the removable/replaceable components can be removed by displacement parallel to a common axis. An I/O device having an I/O base with a lock-out toggle to prevent installation of one or more I/O modules to the I/O base unless a ground screw has been secured to supporting structure.

16 Claims, 9 Drawing Sheets

(56) References Cited

U.S. PATENT DOCUMENTS

| | | | |
|---|---|---|---|
| 10,194,553 B1* | 1/2019 | Chakraborty | H05K 7/1468 |
| 10,483,663 B2 | 11/2019 | Wrobel et al. | |
| 10,579,558 B1 | 3/2020 | Sundaresh et al. | |
| 10,631,426 B1 | 4/2020 | Lostoski et al. | |
| 2007/0016701 A1 | 1/2007 | Siorek et al. | |
| 2012/0092826 A1* | 4/2012 | Heidepriem | H01L 23/4006 |
| | | | 361/679.54 |
| 2012/0102715 A1 | 5/2012 | Chin et al. | |
| 2014/0226460 A1 | 8/2014 | Kretschmann et al. | |
| 2015/0270652 A1 | 9/2015 | Lostoski et al. | |
| 2016/0283427 A1* | 9/2016 | Chaudhari | G06F 13/404 |
| 2018/0113830 A1 | 4/2018 | Sherriff et al. | |
| 2019/0140373 A1 | 5/2019 | Wrobel et al. | |

FOREIGN PATENT DOCUMENTS

| | | | |
|---|---|---|---|
| EP | 3051370 A1 | 8/2016 | |
| EP | 3484253 A1 | 5/2019 | |

OTHER PUBLICATIONS

Allen-Bradley Rockwell Automation Manual titled "Terminal Base Assembly Modules", Publication 5094-IN010D-EN-P, Apr. 2019.
Partial European Search Report, dated Dec. 22, 2020, in connection with European Appln. No. 20187673.7.
Extended European Search Report, dated Feb. 17, 2021, in connection with European Appln. No. 20187673.7

* cited by examiner

INPUT/OUTPUT SYSTEM

FIELD

The present development relates to industrial automation control systems and, more particularly, to a modular input/output (I/O) system.

BACKGROUND INFORMATION

Distributed modular input/output (I/O) systems for industrial automation control systems are well-known and in widespread use. Referring to FIG. 1, a known distributed modular I/O system 10 includes a network adapter 12 that is operatively connected to an industrial automation network N such as an Ethernet/IP network or other industrial automation network so that the network adapter 12 receives data from, transmits data to, and otherwise communicates with an industrial control module or "controller" C also connected to the network N. The controller C comprises one or more programmable logic controllers (PLC), microprocessors, and/or other electronic processors.

The adapter 12 includes an adapter base 12a that is mounted to a DIN rail D or other support structure, and an adapter module 12b is permanently or releasably connected to the adapter base 12a. The adapter module 12b includes the electronic circuitry for data communication data with the controller C via network N and for data communication with multiple I/O devices 20 of the system 10 as described below. The adapter 12 comprises one or more network connectors NC for connecting with the network N via known connectors such as RJ45 connectors, Small FormFactor Pluggable (SFP) connectors, or the like. The adapter 12 typically also includes a power input connector PC for connecting with a source of electrical power for supplying electrical power to the adapter module 12 and to the I/O devices 20 and other components operatively connected to the adapter 12 and/or I/O devices 20.

The I/O devices 20 each include an I/O base 20a also mounted to the DIN rail D or other support structure, with a first I/O base 20a located adjacent and operably physically and electrically connected to the adapter base 12a by a multi-contact electrical connector K and with the additional I/O bases 20a operably physically and electrically connected together one after the other in a sequential manner by successive mating multi-contact electrical connectors K such that a modular backplane circuit or "backplane" (illustrated as a broken line 14) is constructed and adapted for communicating electrical power and data through the successively connected I/O bases 20a and operably connects each I/O base 20a to the network adapter 12 and, thus, to the controller C. In addition to the I/O base 20a, each I/O device 20 further comprises an I/O module 20b operatively removably connected to the I/O base 20a such that the installed I/O module 20b also communicates with the network adapter 12 and the controller C over the backplane 14 such that input/output data are provided between the controller C and each I/O module 20b via backplane 14. Each installed I/O module 20b is selected and configured to perform one or more specialized input/output functions such as DC input, DC output, AC input, AC output, analog input and/or output, RTD and/or thermocouple input and/or thermocouple output, or the like as is generally known in the field of industrial automation.

Each I/O base 20a further includes a terminal block 20c comprising a plurality of cage clamps, spring clamps, screw terminals, or other wiring connectors 20d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controller C. The terminal block 20c can be a separate structure that is assembled to the I/O base 20a or can alternatively be defined as an integral or one-piece part of the I/O base 20a. Different varieties of terminal blocks 20a can be used depending upon the particular configuration required for the field device wiring connectors 20d, with some having different common terminals, ground connections, voltage supply terminals, and the like. Each installed I/O module 20b communicates with the field device wiring connectors 20d of the same I/O base 20a to which the I/O module 20b is physically connected. Input/output data are provided between the controller C and field device(s) FD connected to the corresponding I/O base 20a via backplane 14 and the network adapter module 12b.

FIG. 2A is a schematic representation of the distributed modular input/output (I/O) system 10 of FIG. 1. It can be seen that the backplane 14 includes only a single (non-redundant) circuit 14a that sequentially connects the network adapter 12 and the successively adjacent I/O devices 20 in a series or a sequential "daisy-chain" manner through the mated connectors K in the adapter base 12a and I/O bases 20a. In particular, the adapter 12 and each I/O device 20 include backplane circuitry that is located in the respective base 12a, 20a and/or that is located in the adapter or I/O module 12b, 20b connected to the respective base and that establishes the above-described backplane circuit 14 using known backplane data communication protocols. FIG. 2B is similar but shows another known system 10' wherein the network adapter 12' includes first and second redundant adapter modules 12b1, 12b2 connected to the base 12a and wherein each I/O device 20' includes first and second redundant I/O modules 20b1, 20b2 connected to the base 20a. In the case of FIG. 2B, fault tolerance is improved because a failed adapter module 12b1, 12b2 or a failed I/O module 20b1, 20b2 can be replaced without interrupting operation of the modular I/O system 10, 10'. Like the system 10 of FIG. 2A, however, the backplane 14 includes only a single (non-redundant) circuit 14a that sequentially connects the network adapter 12 and the successively adjacent I/O devices 20 in a series or "daisy-chain" manner such that the backplane circuit 14 is interrupted by only a single point of failure.

SUMMARY

The systems of FIGS. 1, 2A, 2B do not provide a truly fault tolerant system in that the certain components are not redundant. Thus, if any single component fails at least a portion of the system and/or devices connected thereto are offline until a repair can be made or system functionality can otherwise be restored. A need has been identified for an I/O system that avoids this single-point failure outcome for certain applications including many industrial automation control applications, such as distributed control systems for process and plant control where continuous and uninterrupted operation of the controlled process or system is a critical requirement. In addition, such a system should allow for easy repair and configuration of redundant components (e.g., a pair of I/O modules operating in simplex vs. a pair of I/O modules operating in duplex).

In accordance with one aspect of the present development, an I/O device comprises an I/O base, at least two I/O modules supported in respective I/O module slots of the I/O base, at least two ethernet switches supported in respective ethernet switch ports of the I/O base, and at least one terminal block assembly supported on the I/O base. Each I/O module is electrically coupled to a respective ethernet switch and terminal block via the I/O base, and the at least two I/O modules, at least two ethernet switches, and at least one terminal block are removably attached to the I/O base.

The at least two I/O modules, at least two ethernet switches, and at least one terminal block can be removable from the I/O base along a common axis. The I/O base can include a ground screw configured to be secured to an associated support to which the I/O base is mountable, the ground screw movable between a first unsecured position and a second secured position. A lock-out toggle can be supported adjacent at least one of the I/O module slots of the I/O base, the lock-out toggle movable between a first position at least partially blocking at least one I/O module slot and a second position not blocking the at least one I/O module slot. The ground screw can restrict movement of the lock-out toggle to the second position when the ground screw is in the unsecured position. The lock-out toggle can be rotatable between the first and second positions, and the lock-out toggle can have a longitudinal axis that is parallel to a longitudinal axis of the at least one I/O module slot when the lock-out toggle is in the second position, whereby insertion of an I/O module into the at least I/O module slot is restricted unless the ground screw is in the secured position and the lock-out toggle is in the second position. The lock-out toggle can be supported on the I/O base in a location between the I/O module slots and at least partially block a portion of each of the I/O module slots when in the first position. A biasing member can be provided for biasing the ground screw towards the unsecured position.

In accordance with another aspect, an I/O base for an I/O device comprises at least two I/O module slots for receiving respective removable I/O modules therein, at least two ethernet switch ports for receiving respective removable ethernet switches, and at least two terminal block ports for receiving at least a portion of a removable terminal block.

The I/O base can further include a ground screw configured to be secured to an associated support to which the I/O base is mountable, the ground screw movable between a first unsecured position and a second secured position. A lock-out toggle can be supported adjacent at least one of the I/O module slots of the I/O base, the lock-out toggle movable between a first position at least partially blocking at least one of the I/O module slots and a second position not blocking the at least one I/O module slot. The ground screw can restrict movement of the lock-out toggle to the second position when the ground screw is in the unsecured position. The lock-out toggle can be rotatable between the first and second positions, and the lock-out toggle can have a longitudinal axis that is parallel to a longitudinal axis of the at least one I/O module slot when the lock-out toggle is in the second position, whereby insertion of an I/O module into the at least I/O module slot is restricted unless the ground screw is in the secured position and the lock-out toggle is rotated to the second position. The lock-out toggle can be supported on the I/O base in a location between two I/O module slots and at least partially block a portion of each of the two I/O module slots when in the first position. A biasing member can be provided for biasing the ground screw towards the unsecured position.

In accordance with another aspect, a method of assembling an I/O device on an associated support comprises placing an I/O base on the support, securing a ground screw of the I/O base to the support, rotating a lock-out toggle from a first position blocking an I/O module slot of the I/O base to a second position not blocking the I/O module slot. Securing the ground screw can include moving the ground screw from an unsecured position blocking rotation of the lock-out toggle to a secured position not blocking rotation of the lock-out toggle. The method can include installing an I/O module in the I/O module slot after the ground screw is secured to the associated support and the lock-out toggle is rotated to the second position. The method can include installing at least one ethernet switch in an ethernet switch port of the I/O base and/or installing at least one terminal block in a terminal block port of the I/O base.

In accordance with another aspect, an I/O adapter comprises an I/O adapter base, at least two removable ethernet switches supported on the I/O adapter base, at least two removable adapter modules supported on the I/O adapter base, at least two removable media landing modules supported on the I/O adapter base, and at least two removable power conditioning modules supported on the I/O adapter base.

DETAILED DESCRIPTION

Figure 1:
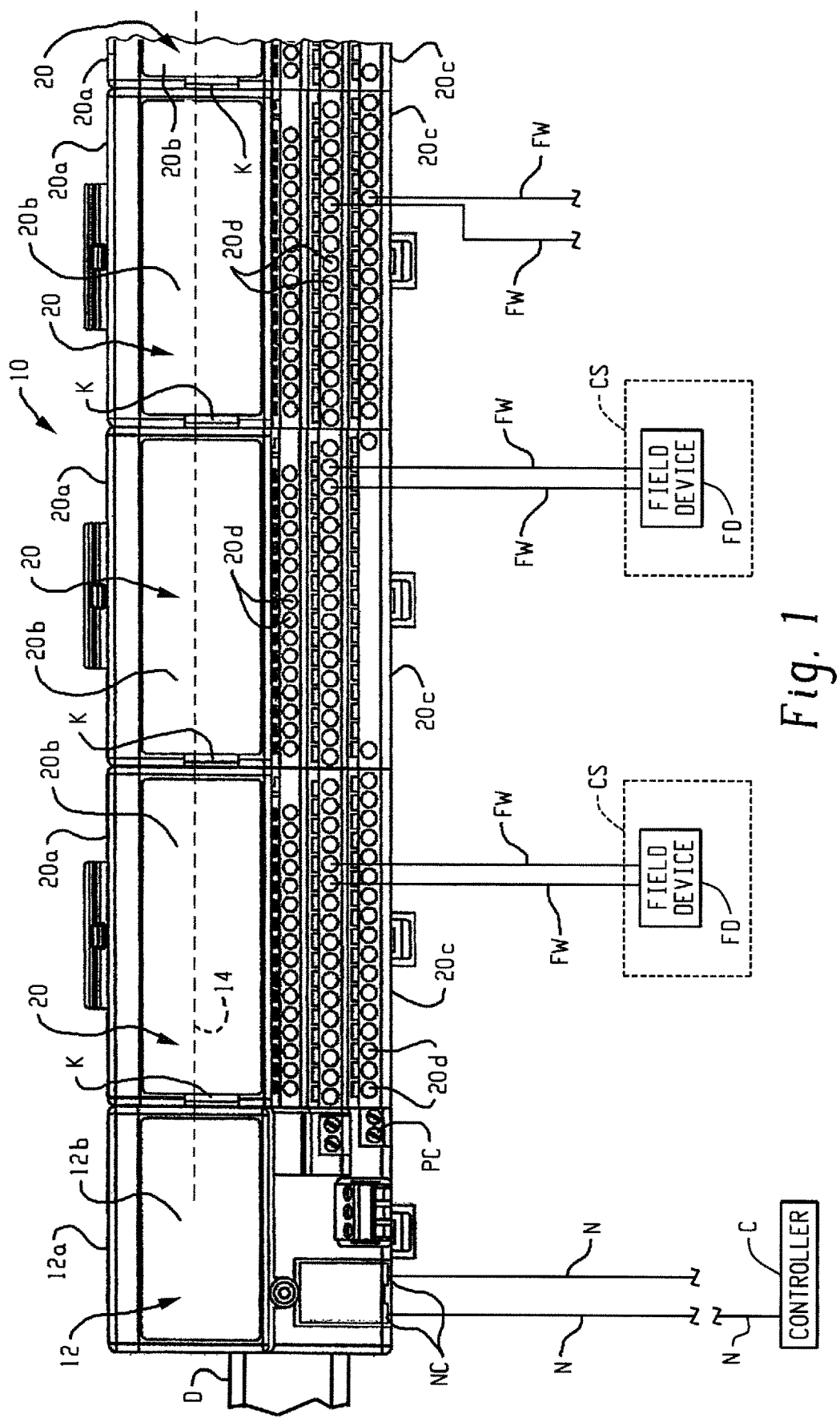
FIG. 1 shows an example of an industrial control system including an industrial automation controller and a known distributed modular input/output (I/O) system.
Figure 2A:
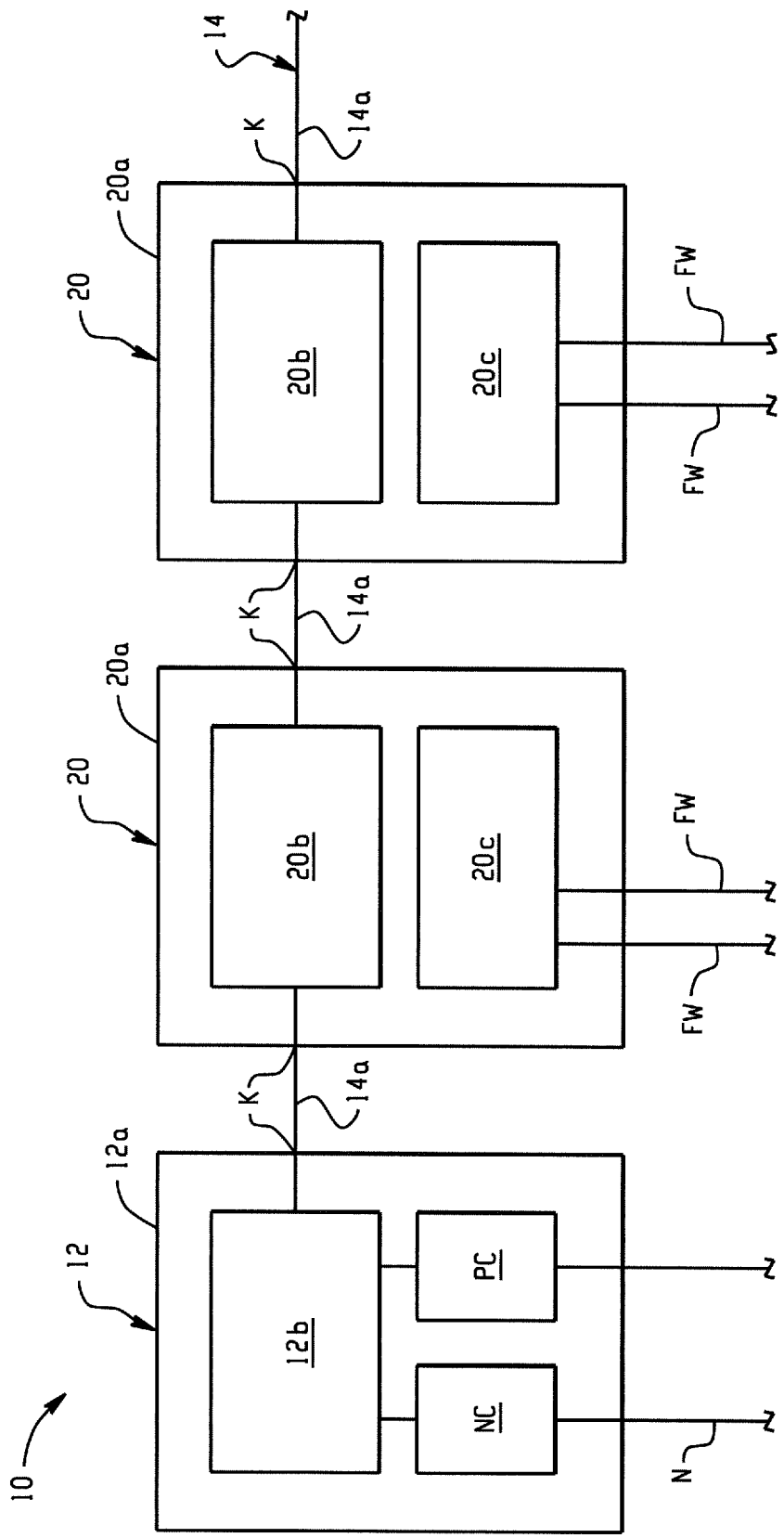
FIG. 2A is a schematic diagram of distributed modular I/O system.
Figure 2B:
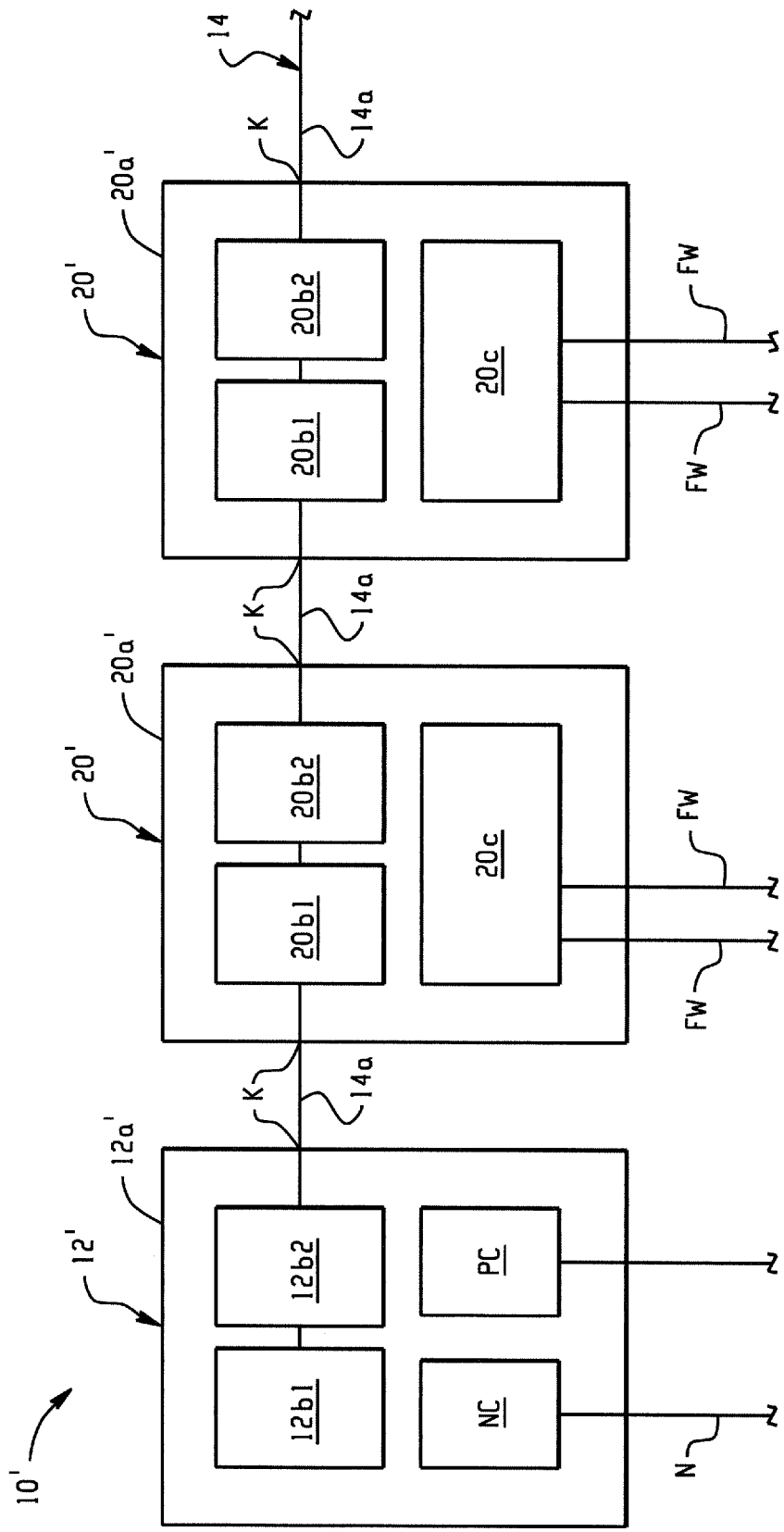
FIG. 2B is a schematic diagram of another distributed modular I/O system.
Figure 3:
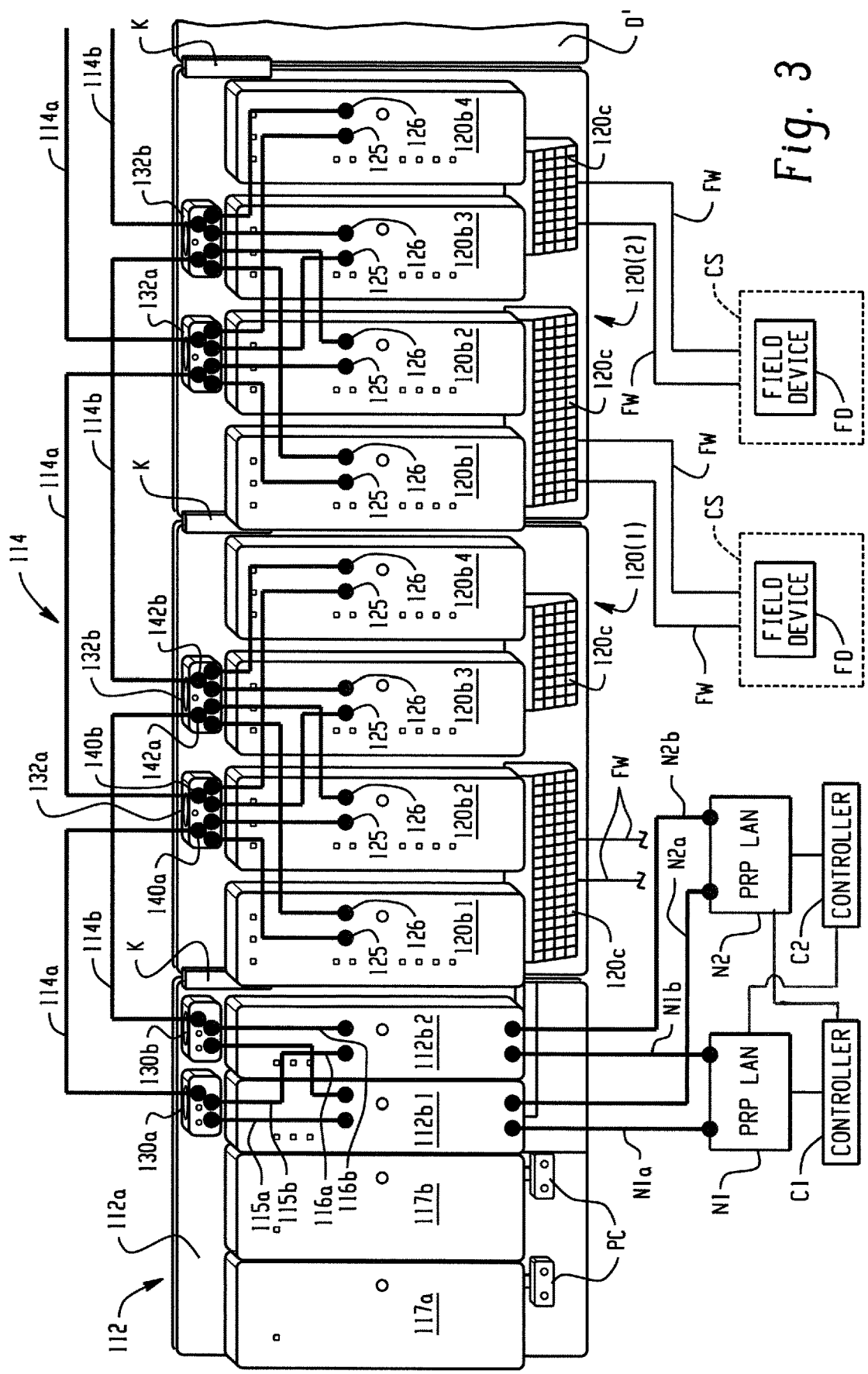
FIG. 3 is an exemplary distributed I/O system in accordance with the present disclosure.
Figure 4:
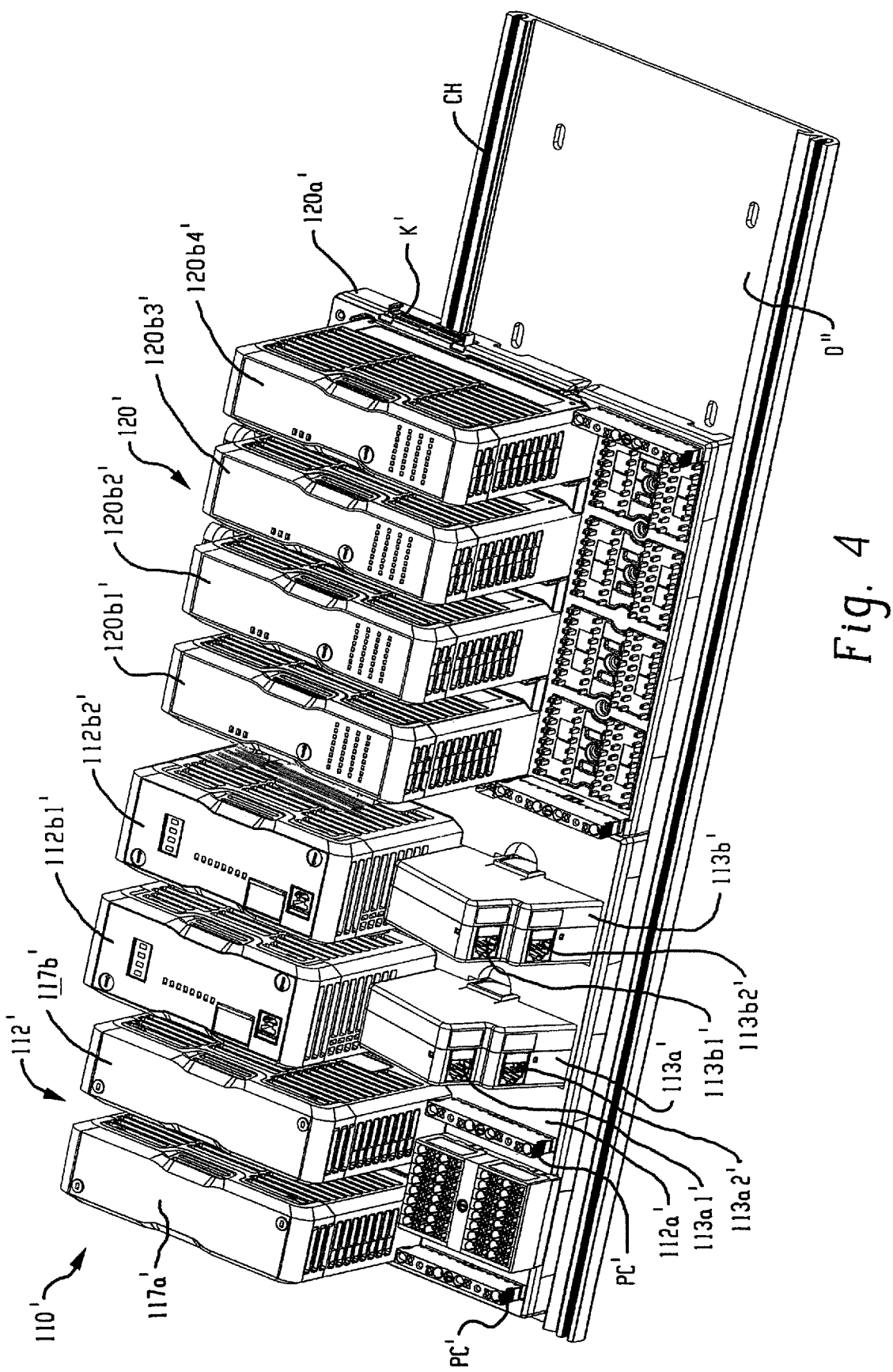
FIG. 4 is a perspective view of an exemplary I/O system including an I/O adapter and an I/O device.

FIG. 3 shows a distributed modular I/O system 110 in accordance with an embodiment of the present development. As described in detail below, the system 110 comprises redundant backplane 114 for improved fault tolerance. In one example, the backplane 114 comprises first and second redundant ethernet networks 114a, 114b implementing a suitable Ethernet data communications protocol such as a gigabit speed protocol but any other network and/or communications protocol can be implemented without departing from the scope and intent of the present development.

The distributed modular I/O system 110 includes a network adapter 112 that is operatively connected to at least one industrial automation network N1, N2. As shown herein, the network adapter is connected to first and second redundant industrial automation networks N1, N2 such as first and second Parallel Redundancy Protocol (PRP) LAN networks or the like such as Ethernet/IP networks or other industrial automation networks so that the network adapter 112 receives data from, transmits data to, and otherwise communicates with one or more industrial control modules or "controllers" C1, C2 connected respectively to the networks N1, N2. The controllers C1, C2 comprises one or more programmable logic controllers (PLC), microprocessors, and/or other electronic processors for machine and/or process control.

The network adapter 112 includes an adapter base 112a that is mounted to a rail D' or other support structure. The network adapter 112 further comprises first and second identical or otherwise redundant adapter modules 112b1, 112b2 that are operating in parallel with each other and each of which is permanently or releasably connected to the adapter base 112a. Each adapter module 112b1, 112b2 is operably connected to both the first and second networks N1, N2 through the adapter base 12a and includes the electronic circuitry for data communication data with the controllers C1, C2 via networks N1, N2 and for data communication with multiple I/O devices 120 of the system 110 as described below. The adapter 112 further comprises one or more network connectors NC connected to the adapter base 112a that are adapted for connecting the adapter modules 112b1, 112b2 to the networks N1, N2 via known connectors such as RJ45 connectors, Small Form-Factor Pluggable (SFP) connectors, optical fiber connectors, and/or the like.

The network adapter 112 further comprises first and second redundant power conditioning modules 117a, 117b connected to the adapter base 112a and each including a power input connector PC for connecting with a source of electrical power for supplying system electrical power to the network adapter 112 and to the I/O devices 120 and other components operatively connected to the adapter 112 and/or I/O devices 120.

The I/O system 110 further comprises one or more I/O devices 120 that each include an I/O base 120a also mounted to the support rail D' or other support structure, with a first I/O base 120a located adjacent and operably physically and electrically connected to the adapter base 112a by a multi-contact electrical connector K and with the additional I/O bases 120a operably physically and electrically connected together one after the other in a sequential manner by successive mating multi-contact electrical connectors K such that a modular backplane circuit or backplane network (generally a "backplane" and schematically illustrated at 114) is constructed and adapted for communicating system electrical power and data through the successively connected I/O bases 120a and operably connects each I/O base 120a to the network adapter 112 and, thus, to the first and second industrial networks N1, N2 and the first and second controllers C1, C2. To facilitate an understanding of the present development, FIG. 3 schematically shows the backplane 114 as being external to the I/O device 110, but those of ordinary skill in the art will recognize that the backplane circuit or network 114 is physically constructed within and extends through the adapter bases 112a and the successively connected I/O bases 120a via mated connectors K. As shown, the system 110 includes first and second I/O devices 120(1) and 120(2).

With respect to the connectors K, the network adapter base 112a and the I/O base 120a of the first I/O device include respective connectors K that operably mate with each other to physically connect the first and second backplane circuits/networks between the network adapter 112 and the first I/O device 120. Similarly, the first and second I/O devices 120(1) and 120(2) include respective connectors K that operably mate with each other to physically connect the first and second backplane circuits/networks between the first and second I/O devices 120(1), 120(2).

In addition to the I/O base 120a, each I/O device 120 further comprises at least two I/O modules 120b (shown herein as I/O modules 120b1, 120b2, 120b3, 120b4) operatively removably connected to the I/O base 120a such that each of the installed I/O modules 120b also communicates with the network adapter 112 and the first and second controllers C1, C2 over the backplane 114 whereby input/output data are provided between the controllers C1, C2 and each I/O module 120b via backplane 114. Each installed I/O module 120b is selected and configured to perform one or more specialized input/output functions such as DC input, DC output, AC input, AC output, analog input and/or output, RTD and/or thermocouple input and/or output, or the like as is generally known in the field of industrial automation.

Each I/O device includes at least two separate I/O modules 120 (120b1, 120b2) each operatively removably connected to the I/O base 120a. In the illustrated embodiment, which is not intended to be limiting in any way, each I/O device 120 comprises four separate I/O modules 120b (120b1, 120b2, 120b3, 120b4) each operatively removably connected to the I/O base 120a, and at least two of the I/O modules 120b are identical to each other and operated in parallel with each other to provide a redundancy with respect to each other (as shown, the I/O modules 120b3, 120b4 of the two illustrated I/O devices 120 are identical and operated redundantly in parallel with respect to each other).

Each I/O base 120a further includes at least one terminal block 120c comprising a plurality of cage clamps, spring clamps, screw terminals, or other wiring connectors 120d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controllers C1, C2. Each terminal block 120c can be a separate structure that is assembled to the I/O base 120a or can alternatively be defined as an integral or one-piece part of the I/O base 120a. Different varieties of terminal blocks 120a can be used depending upon the particular configuration required for the field device wiring connectors 120d, with some having different common terminals, ground connections, voltage supply terminals, and the like. Each installed I/O module 120b communicates with the field device wiring connectors 120d of the same I/O base 120a on which the I/O module 120b is physically installed. Input/output data are provided between the controllers C1, C2 and field device(s) FD connected to the corresponding I/O base 120a via backplane 114 and the network adapter modules 112b1, 112b2. In the illustrated embodiment, the redundant, parallel I/O modules 120b3, 120b4 share a common terminal block 120c such that the redundant I/O modules 120b3, 120b4 are operably connected to the same field wiring FW to send data to and receive data from the controlled system CS.

The network adapter 112 includes first and second independent "adapter" Ethernet switches 130a, 130b that each are operably connected to, form part of, and establish the backplane 114. Similarly, each I/O device 120 includes first and second independent "I/O module" Ethernet switches 132a, 132b that each are operably connected to, form part of, and establish the backplane 114. The switches 130a, 130b (generally 130) of the network adapter 112 and the switches 132a, 132b (generally 132) of each I/O module 120 can be and are identical in the present embodiment but they are numbered differently herein to facilitate the description of their operation. In each case, as is generally known in the art, the Ethernet switches 130, 132 perform a packet switching operation that directs Ethernet network traffic from an input port of the switch to a particular output port of the same switch using the Media Access Control address(es) (MAC addresses) of the device(s) connected to the output port of the switch 130, 132. As used herein, the term "Ethernet switch" is intended to encompass any multi-port Ethernet network device that maps/directs network data from a first (input) port on the switch device 130, 132 to a second (output) port on the switch device 130, 132 using information contained in the network data that describes the intended destination for the network data.

With respect to the network adapter 112, each Ethernet switch 130 is physically connected to the adapter base 112a, preferably by a releasable connection. Likewise, with respect to each I/O device 120, each Ethernet switch 132 is physically connected to the I/O base 120a, preferably by a releasable connection. For both the network adapter 112 and each I/O device 120, each Ethernet switch 130, 132 is operably connected to the backplane 114 for communication of data on the backplane 114. The switches 130a, 130b can be powered by a separate electrical power connection through the bases 112a, 120a and/or using a Power over Ethernet (PoE) connection or other power delivery method through the backplane network 114, itself.

The switches 130 of the network adapter 112 each have at least three ports to implement a backplane 114 in accordance with the present development as described further below. Similarly, the switches 132 of each I/O module 120 have at least three ports to implement a backplane 114 in accordance with the present development as described further below. More particularly, the switches of the I/O devices 120 can each have at least (2+n) ports, where "n" is the number of I/O modules 120b connected to the I/O base 120a.

In contrast to known systems, the present distributed I/O system 110 uses the first and second Ethernet switches 130a, 130b of the network adapter 112 to establish and maintain first and second Ethernet backplane networks 114a, 114b that are completely redundant and independent with respect to each other.

As shown in FIG. 3, each adapter module 112b1, 112b2 is operably connected to both of the first and second industrial control system networks N1, N2 via connections N1a, N1b and N2a, N2b. Furthermore, each Ethernet switch 130 of the adapter 112 is operably connected to both adapter modules 112b1, 112b2. In particular, switches 130a, 130b are connected to adapter module 112b1 by respective connections 115a, 115b and switches 130a, 130b are connected to adapter module 112b2 by respective connections 116a, 116b. The switch 130a establishes the first backplane network 114a in operative communication with the first adapter module 112b1 on one of its ports, and the switch 130b establishes the second backplane network 114b in operative communication with the second adapter module 112b2 on one of its ports. As such, the first backplane network 114a is in operative communication with both the first and second adapter modules 112b1, 112b2, and the second backplane network 114b is also independently in operative communication with both the first and second adapter modules 112b1, 112b2.

Similarly, the first and second Ethernet switches 132a, 132b of each I/O device 120 are each connected to each I/O module 120b (120b1, 120b2, 120b3, 120b4) by respective first connections 125 (for the first switch 132a) and respective second connections 126 (for the second switch 132b). The first switch 132a includes first (upstream) and second (downstream) "first backplane" propagation ports 140a, 140b that are respectively connected to upstream and downstream segments of the first backplane 114a (with "upstream" meaning logically closer to the corresponding/first Ethernet switch 130a of the network adapter 112 as compared to "downstream"). In the same manner, the second switch 132b includes first (upstream) and second (downstream) "second backplane" propagation ports 142a, 142b that are respectively connected to upstream and downstream segments of the second backplane 114b (again, with "upstream" meaning logically closer to the corresponding/second Ethernet switch 130b of the network adapter 112 as compared to "downstream"). Because the first and second backplane circuits/backplane networks 114a, 114b are physically constructed through the bases 112a, 120a and connectors K, the first adapter Ethernet backplane switch 130a and the first I/O device Ethernet switches 132a of the successive I/O devices 120 are connected together in a serial or daisy-chain manner through the adapter 112 and the successively adjacent I/O devices 120 to form the first backplane 114a. Similarly, the second adapter Ethernet backplane switch 130b and the second I/O device switches 132a of the successive I/O devices 120 are connected together in a serial or daisy-chain manner through the adapter 112 and the successively adjacent I/O devices 120 to form the second backplane 114b.

Those of ordinary skill in the art will recognize that, since the first and second backplanes 114a, 114b are independent and redundant, the distributed I/O device 110 will continue to operate even upon a failure of either the first backplane 114a or the second backplane 114b, since the other operating (non-failed) backplane 114a, 114b provides a path for all backplane power and data. Furthermore, since the Ethernet backplane switches 130, 132 are releasably connected to the bases 112a, 120a, a failed switch 130, 132 of one of the backplane networks 114a, 114b can be unplugged and replaced while the distributed I/O device 110 is operative using the other backplane 114a, 114b of which the replaced switch 130, 132 is not a part. Other than the switches 130, 132, the backplane circuitry of the adapter base 112a and each I/O base 120a is completely passive and provided by printed circuit board (PCB) or other passive electrical connection within the network adapter base 112a and each I/O base 120a which greatly improves fault tolerance because the probability of a failure of the passive components of the backplane network 114 is very low as compared to the active switches 130, 132 which are replaceable during operation of the I/O device 110 as noted above.

With the foregoing description of the components and function of I/O system 110 in mind, and turning to FIGS. 4-8, an exemplary physical embodiment of an exemplary I/O system 110' in accordance with aspects of the present disclosure is illustrated. To differentiate from the I/O system 110 of FIG. 3, the components of the I/O system 110' of FIGS. 4-8 are identified with corresponding primed reference numerals. It should be appreciated, however, that the components and functionality of I/O system 110' is general identical to I/O system 110.

I/O system 110' generally includes a network adapter 112' supported on an adapter base 112a' that is mounted to a rail D" or other support structure. The network adapter 112' further comprises first and second identical or otherwise redundant adapter modules 112b1', 112b2' that are operating in parallel with each other and each of which releasably connected to the adapter base 112a'. In this embodiment, each adapter module 112b1', 112b2' is operably connected to first and second networks (not shown) through media landing modules 113a' and 113b'. Media landing modules 113a' and 113b' each have first and second ports 113a1'/113a2' and 113b1'/113b2' for coupling to respective first and second networks (e.g., N1/N2 in the system of FIG. 3). The media landing modules 113a'/113b' allow an installer to couple the adapter modules 112b1'/112b2' to a wide variety of network types by selecting and installing a media landing module that corresponds to a particular network type (e.g., ethernet, RJ45, Small FormFactor Pluggable (SFP) connectors, optical fiber connectors, and/or the like).

The network adapter 112' further comprises first and second redundant power conditioning modules 117a', 117b' connected to the adapter base 112a' and each including a power input connector PC' for connecting with a source of electrical power for supplying system electrical power to the network adapter 112' and to the I/O devices 120' and other components operatively connected to the adapter 112' and/or I/O devices 120'.

The I/O system 110' further comprises one or more I/O devices 120' that each include an I/O base 120a' also mounted to the support rail D" or other support structure, with a first I/O base 120a' located adjacent and operably physically and electrically connected to the adapter base 112a' by a multi-contact electrical connector K' and with additional I/O bases (not shown) operably physically and electrically connected together one after the other in a sequential manner by successive mating multi-contact electrical connectors K' such that a modular backplane circuit or backplane network is constructed and adapted for communicating system electrical power and data through the successively connected I/O bases 120a' and operably connects each I/O base 120a' to the network adapter 112'.

Figure 5:
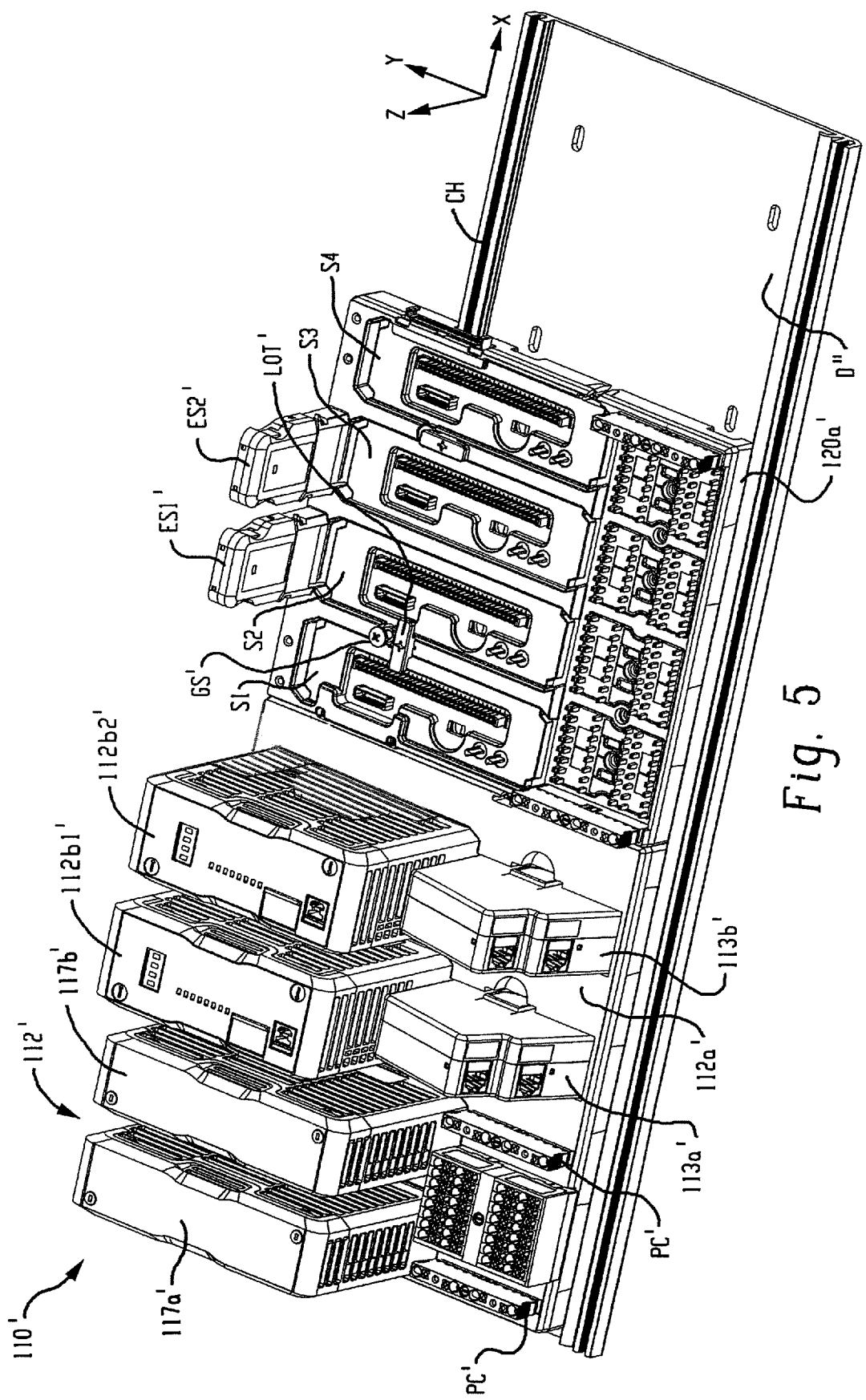
FIG. 5 is a perspective view of the I/O system of FIG. 4 with I/O modules removed from the I/O base.
Figure 6:
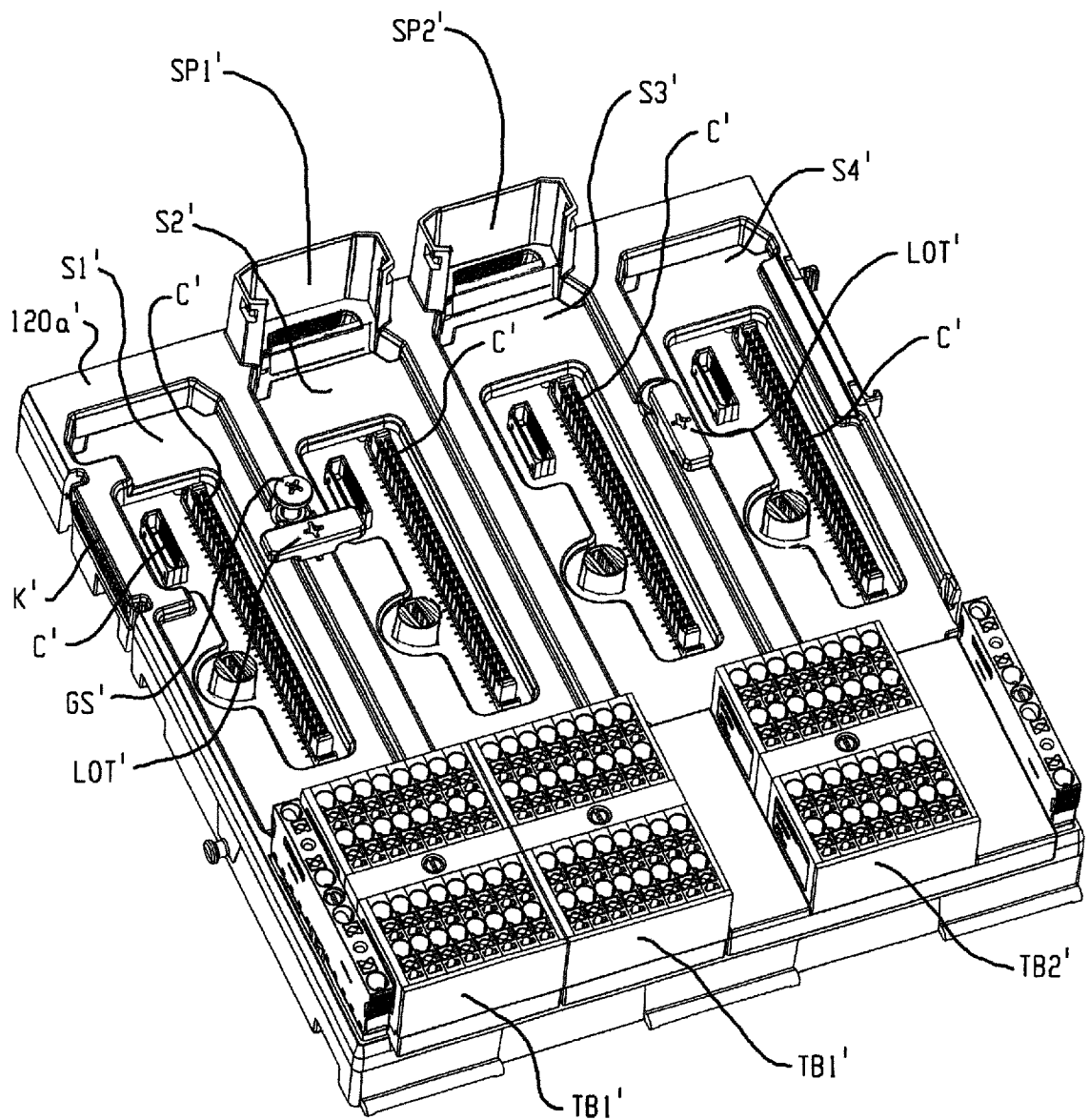
FIG. 6 is a perspective view of an I/O base in accordance with the present disclosure.

In FIGS. 5 and 6, I/O base 120a' is illustrated without adapter modules installed. The I/O base 120a' includes four slots S1'-S4' for receiving one of the respective I/O modules 120b1'-120b4' (see FIG. 4). Each slot S1-S4 includes connectors C' for connecting an I/O module received therein to one or more of a terminal block TB1'/TB2' for connection to a field device, one or more backplanes, and/or a power supply.

The I/O base 120a' also includes first and second ethernet switch ports SP1'/SP2' for receiving respective ethernet switches ES1'/ES2' that are configured to link the I/O modules and other related devices to the first and second backplanes. The ethernet switched ES1'/ES2' are removably secured in switch ports SP1'/SP2' of the I/O base 120a'. Like the other components of the I/O system 110', the ethernet switches ES1'/ES2' can be removed from the I/O base 120a' along the Z-axis.

Figure 7:
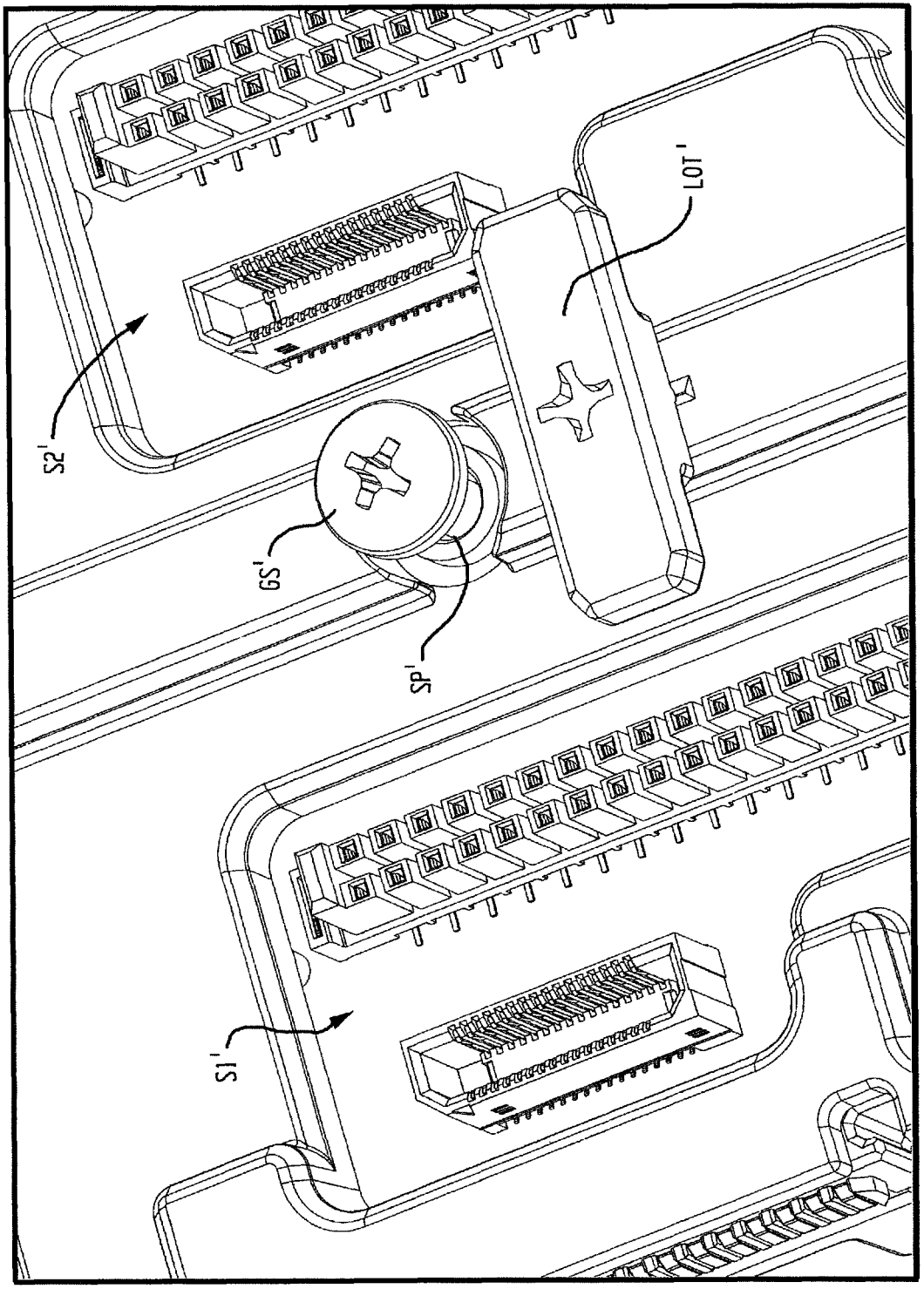
FIG. 7 is a perspective top view of a ground screw and lock-out toggle of the I/O base in a first configuration.
Figure 8:
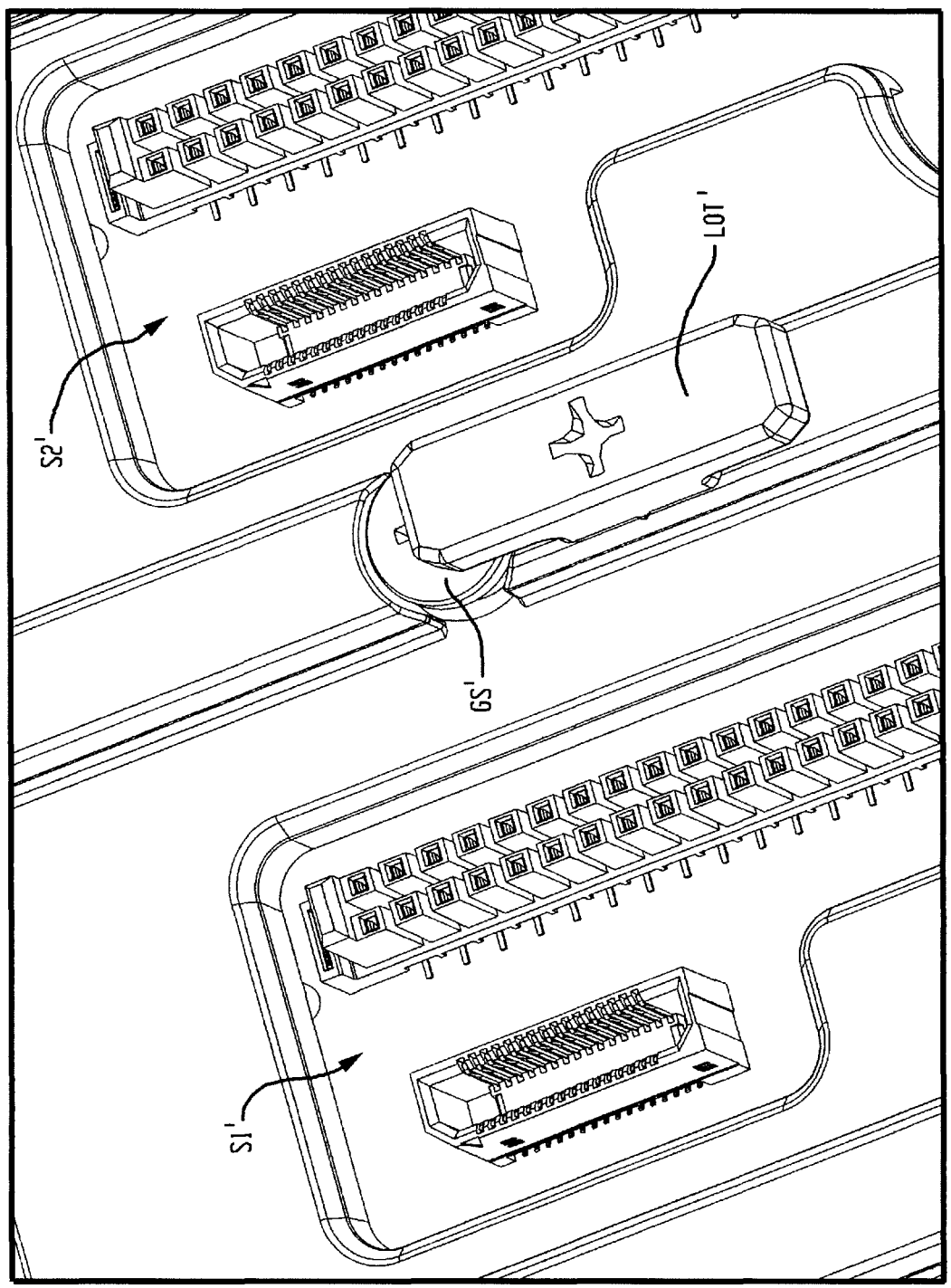
FIG. 8 is a perspective top view of the ground screw and lock-out toggle of the I/O base in a second configuration.

As shown in FIG. 6, and with additional reference to FIGS. 7 and 8, the I/O base 120a' further includes a lock-out toggle LOT' between each pair of slots S1'/S2' and S3'/S4'. The lock-out toggle LOT' functions in cooperation with a ground screw GS' to prevent installation of an I/O module into an adjacent slot of the I/O base 120a' unless and until the ground screw GS' is tightened (e.g., secured to the DIN rail or other support structure) and the lock-out toggle LOT' is rotated from a first position at least partially blocking an adjacent slot to a second position not blocking the slot.

The lock-out toggle LOT' is mounted for rotation between the lockout (first) position of FIG. 7 and a second position generally parallel to a longitudinal axis of the adjacent slots S1' and S2' shown in FIG. 8. In the lock-out position of FIG. 7, the lock-out toggle LOT' at least partially extends into and blocks adjacent slots S1' and S2' from receiving an I/O module. In this position, the unsecured ground screw GS' interferes with the lock-out toggle LOT' preventing rotation of the lock-out toggle LOT' to the second position parallel to slots S1' and S2' shown in FIG. 8. A spring SP' biases the ground screw GS' upwardly towards the interfering unsecured position shown in FIG. 7. The spring SP maintains the ground screw GS in the interfering position until and unless the ground screw GS' is secured into a corresponding channel CH' (see FIG. 4) in the DIN rail D". In FIG. 8, the ground screw GS' has been secured and the lock-out toggle LOT' has been rotated to the parallel position such that an I/O module can be inserted in either or both of adjacent slots S1' and S2'.

It should be appreciated that the lock-out toggle LOT' ensures that the ground screw GS' is secured prior to installation of an I/O module to the I/O base 120a'. As the ground screw GS' is generally not visible once I/O modules are installed in the I/O base 120a', the lock-out toggle LOT' helps to ensure that the ground screw GS' or screws are secured thereby reducing or eliminating installations where a poor/intermittent ground would degrade system performance. In addition, by ensuring that the ground screws are secure, the lock-out toggle LOT' reduces or prevents performance issues that may result from an unsecured I/O device breaking backplane connections.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An I/O device comprising:
an I/O base;
at least two I/O modules supported in respective I/O module slots of the I/O base;
at least two ethernet switches supported in respective ethernet switch ports of the I/O base;
at least one terminal block assembly supported on the I/O base; and
a lock-out toggle supported adjacent at least one of the I/O module slots of the I/O base, the lock-out toggle movable between a first position at least partially blocking at least one I/O module slot and a second position not blocking the at least one I/O module slot;
wherein the I/O base includes a ground screw configured to be secured to an associated support to which the I/O base is mountable, the ground screw movable between a first unsecured position to a second secured position;
wherein each I/O module is electrically coupled to a respective ethernet switch and terminal block via the I/O base; and
wherein the at least two I/O modules, at least two ethernet switches, and at least one terminal block are removably attached to the I/O base.

2. The I/O device of claim 1, wherein the at least two I/O modules, at least two ethernet switches, and at least one terminal block are removable from the I/O base along a common axis.

3. The I/O device of claim 1, wherein the ground screw restricts movement of the lock-out toggle to the second position when the ground screw is in the unsecured position.

4. The I/O device of claim 3, wherein the lock-out toggle is rotatable between the first and second positions, and wherein the lock-out toggle has a longitudinal axis that is parallel to a longitudinal axis of the at least one I/O module slot when the lock-out toggle is in the second position, whereby insertion of an I/O module into the at least I/O module slot is restricted unless the ground screw is secured and the lock-out toggle is rotated to the second position.

5. The I/O module of claim 4, wherein the lock-out toggle is supported on the I/O base in a location between the I/O module slots and at least partially blocks a portion of each of the I/O module slots when in the first position.

6. The I/O device of claim 1, further comprising a biasing member for biasing the ground screw towards the unsecured position.

7. An I/O base for an I/O device comprising;
   at least two I/O module slots for receiving respective removable I/O modules therein;
   at least two ethernet switch ports for receiving respective removable ethernet switches;
   at least two terminal block ports for receiving at least a portion of a removable terminal block;
   a ground screw configured to be secured to an associated support to which the I/O base is mountable, the ground screw movable between a first unsecured position to a second secured position; and
   a lock-out toggle supported adjacent at least one of the I/O module slots of the I/O base, the lock-out toggle movable between a first position at least partially blocking at least one I/O module slot and a second position not blocking the at least one I/O module slot.

8. The I/O base of claim 7, wherein the ground screw restricts movement of the lock-out toggle to the second position when the ground screw is in the unsecured position.

9. The I/O base of claim 8, wherein the lock-out toggle is rotatable between the first and second positions, and wherein the lock-out toggle has a longitudinal axis that is parallel to a longitudinal axis of the at least one I/O module slot when the lock-out toggle is in the second position, whereby insertion of an I/O module into the at least I/O module slot is restricted until the ground screw is secured and the lock-out toggle is rotated to the second position.

10. The I/O base of claim 9, wherein the lock-out toggle is supported on the I/O base in a location between two I/O module slots and at least partially blocks a portion of each of the two I/O module slots when in the first position.

11. The I/O base of claim 7, further comprising a biasing member for biasing the ground screw towards the unsecured position.

12. A method of assembling an I/O device on an associated support comprising:
    placing an I/O base on the support;
    securing a ground screw of the I/O base to the support;
    rotating a lock-out toggle from a first position blocking an I/O module slot of the I/O base to a second position not blocking the I/O module slot;
    wherein the securing the ground screw includes moving the ground screw from an unsecured position blocking rotation of the lock-out toggle to a secured position not blocking rotation of the lock-out toggle.

13. The method of claim 12, further comprising installing an I/O module in the I/O module slot after the grounding screw is secured to the associated support and the lock-out toggle is rotated to the second position.

14. The method of claim 13, further comprising installing at least one ethernet switch in an ethernet switch port of the I/O base.

15. The method of claim 14, further comprising installing at least one terminal block in a terminal block port of the I/O base.

16. An I/O adapter comprising:
    an I/O adapter base;
    at least two removable ethernet switches supported on the I/O adapter base;
    at least two removable adapter modules supported on the I/O adapter base;
    at least two removable media landing modules supported on the I/O adapter base; and
    at least two removable power conditioning modules supported on the I/O adapter base.

* * * * *